(12) United States Patent
Li et al.

(10) Patent No.: US 10,342,132 B2
(45) Date of Patent: Jul. 2, 2019

(54) MEMORY DEVICE WITH INSERTABLE PORTION

(71) Applicant: INTEL CORPORATION, Santa Clara, CA (US)

(72) Inventors: Xiang Li, Portland, OR (US); George Vergis, Portland, OR (US); Slobodan Mrdjan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/839,419

(22) Filed: Dec. 12, 2017

(65) Prior Publication Data

US 2019/0037695 A1    Jan. 31, 2019

(51) Int. Cl.
| | |
|---|---|
| *H05K 7/00* | (2006.01) |
| *H05K 5/00* | (2006.01) |
| *H05K 1/14* | (2006.01) |
| *H05K 1/02* | (2006.01) |
| *H05K 3/46* | (2006.01) |
| *H01R 12/70* | (2011.01) |
| *H01R 12/55* | (2011.01) |
| *H01R 12/52* | (2011.01) |
| *H01R 12/73* | (2011.01) |

(52) U.S. Cl.
CPC .............. *H05K 1/14* (2013.01); *H01R 12/52* (2013.01); *H01R 12/55* (2013.01); *H01R 12/7076* (2013.01); *H01R 12/737* (2013.01); *H05K 1/0228* (2013.01); *H05K 3/46* (2013.01); *H05K 2201/10159* (2013.01)

(58) Field of Classification Search
CPC .......................................................... H05K 7/20
See application file for complete search history.

(56) References Cited

U.S. PATENT DOCUMENTS

2006/0050496 A1\*    3/2006    Goodwin ................. G11C 5/04
                                                                               361/803

\* cited by examiner

*Primary Examiner* — Jerry Wu
(74) *Attorney, Agent, or Firm* — Schwabe, Williamson & Wyatt, P.C.

(57) ABSTRACT

Embodiments of the present disclosure are directed towards a memory device insertable into a PCB, e.g., a motherboard of a computing device. In some embodiments, the memory device may include a first PCB having a first thickness, to house one or more memory modules disposed on at least one side of the first PCB. The memory device may further include a layer having a second thickness, which may be attached to the side of the first PCB in an area that is proximate to an edge of the first PCB, to form a memory device portion that may be insertable into a connector slot disposed on a second PCB. The insertable portion may have a thickness that comprises the first and second thicknesses, to fit into the connector slot of the second PCB. Other embodiments may be described and/or claimed.

9 Claims, 6 Drawing Sheets

MEMORY DEVICE WITH INSERTABLE PORTION

FIELD

Embodiments of the present disclosure generally relate to the field of computing devices, and more particularly, to memory devices insertable into printed circuit boards, such as motherboards of computing devices.

BACKGROUND

In current computing systems, memory devices, such as dynamic random-access memory integrated circuits are widely used. Recently, dual in-line memory modules (DIMM) have replaced single in-line memory modules (SIMM), and have been implemented as double data rate synchronous dynamic random-access memory (DDR SDRAM) of various generations, with fifth generation being most recent. The memory (e.g., DIMM) modules may typically be inserted on in respective connector slots on a printed circuit board (PCB) of a computing system, such as on the motherboard, in proximity to each other. Due to fairly tight distance (pitch) between the modules disposed on the PCB, thermal dissipation may become increasingly challenging, particularly for high density DIMM.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
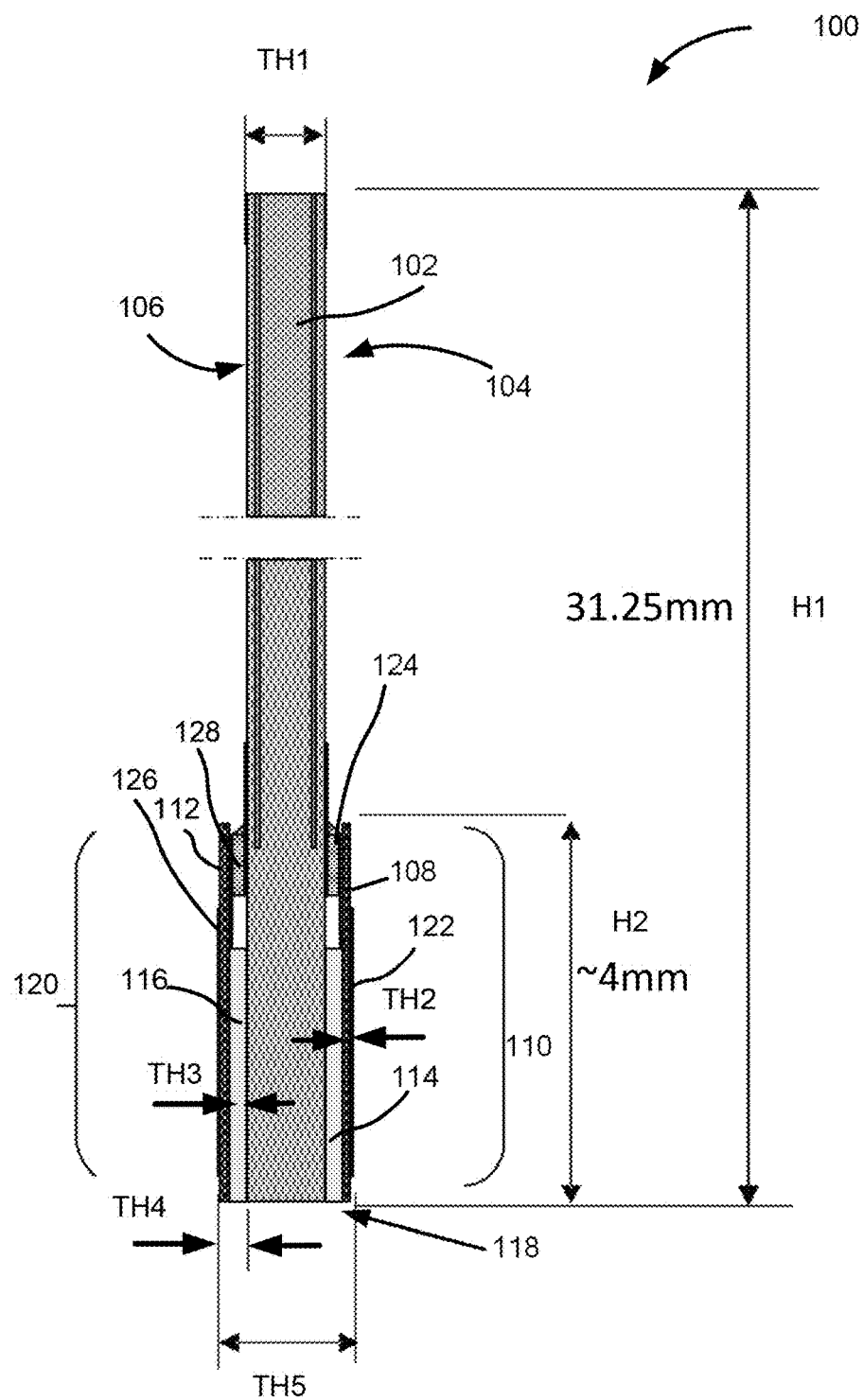
FIG. 1 is a side cross-sectional view of an example memory device, in accordance with some embodiments.

Embodiments of the present disclosure describe techniques and configurations for a memory device insertable into a printed circuit board (PCB). In some embodiments, the memory device may include a first PCB having a first thickness, to house one or more memory modules disposed on at least one side of the first PCB. The memory device may further include a layer having a second thickness, which may be attached to the side of the first PCB in an area that is proximate to an edge of the first PCB, to form a memory device portion that may be insertable into a connector slot disposed on a second PCB. The insertable portion may have a thickness that comprises the first and second thicknesses, to fit into the connector slot of the second PCB. The corresponding connector slot may have a determined width.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 2:
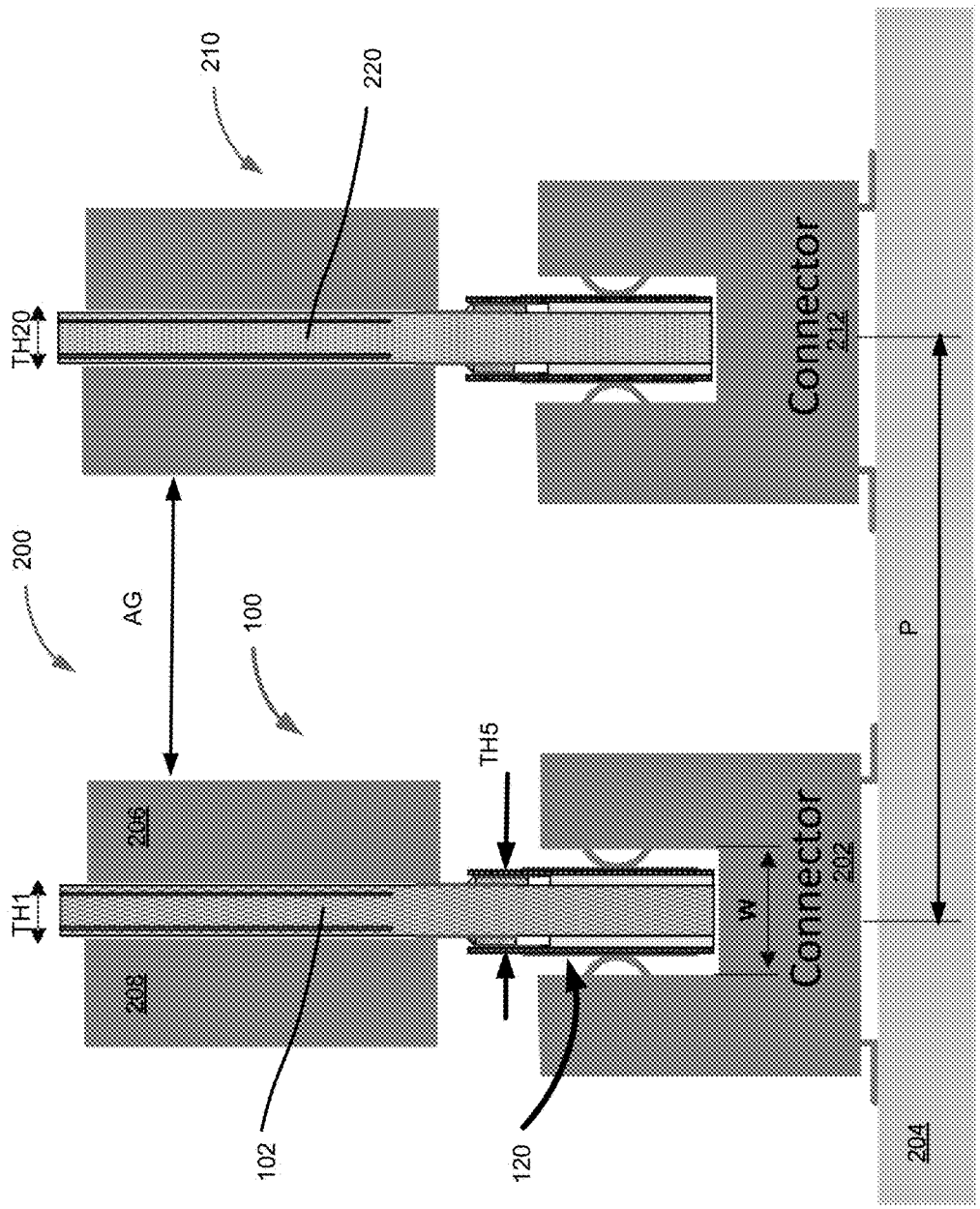
FIG. 2 illustrates a side view of an example computing device that includes the memory device of FIG. 1, in accordance with some embodiments.

FIG. 1 is a side cross-sectional view of an example memory device, in accordance with some embodiments. As shown, the memory device 100 may include a printed circuit board (PCB) 102, which may house one or more memory modules. The memory modules may be disposed on one side 104 of the PCB 102, or on both sides 104 and 106 of the PCB 102 (the memory modules are shown in FIG. 2). As shown, the PCB 102 may have a thickness TH1 and a height H1. In some embodiments, H1 may be about 31.25 mm.

The memory device 100 may further include a layer 108 attached to the side 104 of the PCB 102 in an area 110 that may be proximate to an edge 118 of the PCB 102. In some embodiments, the memory device 100 may further include a layer 112 attached to the side 106 of the PCB 102 in the area 110. The layers 108 and 112 may comprise rigid PCB or flexible printed circuit board (FPC) and have a thickness TH2.

In embodiments, the layers 108 and 112 may be attached to the PCB 102 using respective bonding layers 114 and 116. In embodiments, the bonding layers 114 and 116 may have a thickness TH3. In embodiments, the bonding layer may comprise any dielectric material suitable for bonding. In embodiments, a portion of the PCB 102 (area 110), with one or more layers 108 and/or 112, attached to the PCB 102 with bonding layers 114 and 116, may form a memory device portion 120 that may be insertable into a corresponding connector slot disposed on another PCB, for example, a motherboard of a computing device. In embodiments, the insertable portion 120 of the memory device 120 may have a height H2, for example, about 4 mm.

The combined thickness TH5 of the insertable portion 120 may include PCB 102 thickness TH1 and thicknesses TH4 associated with the layers 108 and 112, where TH4 may equal TH2 (layer 108 or 112) and TH3 (bonding layer 114 or 116). For example, if only one layer (e.g., layer 108) is attached to PCB 102 (with the bonding layer 114), the combined thickness TH5 equals TH1 and TH4. In another example, if both layers 108 and 112 are attached to the PCB 102 with bonding layers 114 and 116, the combined thickness TH5 equals T1 and twice TH4. In embodiments, thickness T5 of the insertable portion 120 may match the width of the corresponding connector slot provided on the motherboard, in order to fit into the connector slot. Accordingly, thickness TH1 of the PCB 102 may be reduced compared to thicknesses of PCB used in conventional solutions, in order to improve air circulation between memory devices, as will be described in reference to FIG. 2.

In some embodiments, thickness TH1 may be about 0.8 mm, and thickness TH5 may be about 1.27 mm (e.g., in implementations related to DDR5 DIMM). In some embodiments, thickness TH1 may be about 0.9 mm, and thickness TH5 may be about 1.40 mm (e.g., in implementations related to DDR4 DIMM). It is understood that the thickness and height values are provided herein by way of example and are not limiting this disclosure. In general, different thickness values TH1 and TH5 may be used, where TH1 is less than TH5, to match the corresponding connector slot provided on the motherboard. Similarly, different heights of the PCB 102 and insertable portion 120 may be used.

In embodiments, the memory device 102 may further include connector components to provide electric connection between the memory modules that may be disposed on the PCB 102 and the motherboard, in response to an insertion of the insertable portion 120 of the PCB 102 into the corresponding connector slot of the motherboard. In embodiments, the connector components may comprise contacts 122 disposed on the layer 108, and contacts 126 disposed on the layer 112, to provide electric connections between the memory device 100 and the motherboard. The connector components may further include interconnects 124 and 128 respectively, to provide connections between the PCB 102 and layers 108 and 112.

FIG. 2 illustrates a side view of an example computing device that includes the memory device of FIG. 1, in accordance with some embodiments. For purposes of explanation, like components of FIGS. 1 and 2 (and subsequent figures) are indicated by like numerals. More specifically, FIG. 2 illustrates the memory device 102 of a computing system 200, inserted in a corresponding connector slot 202 disposed on a PCB 204. In embodiments, the PCB 204 may comprise a motherboard of the computing device 200.

As shown, the memory device 100 may include one or more memory modules 206 and 208 disposed on either side of the PCB 102, as shown. In embodiments, the insertable portion 120 of the memory device 100 may be inserted into the connector slot 202 disposed on the PCB 204. In embodiments, the connector slot may comprise a double data rate (e.g., DDR5) connector. The memory modules may include a dynamic random-access memory (DRAM), registering clock driver (RCD), power management integrated circuit (PMIC), and other components. In embodiments, the memory device 100 may comprise a dual in-line memory module (DIMM).

In embodiments, multiple memory devices (e.g., 100, 210) may be disposed on the PCB 204. The connectors 202 and 212 may be disposed on the PCB 204 at a determined pitch P from each other. As described in reference to FIG. 1, the connector slot 202 may have a determined width W, and the insertable portion may have the thickness TH5 that may fit into the connector slot, as shown. Because the insertable portion 120 of the memory device 100 may be configured to fit into the connector 202, the thickness TH1 of the PCB 102 may be reduced, compared to conventional solutions. The reduction of respective thicknesses TH1 and TH20 of the PCB 102 and 220 of the memory devices 100 and 210 may result in an increased air gap AG between the devices 100 and 210. Wider air gap between the memory devices may reduce the air flow impedance and improve thermal dissipation of the computing system 200.

Figure 3:
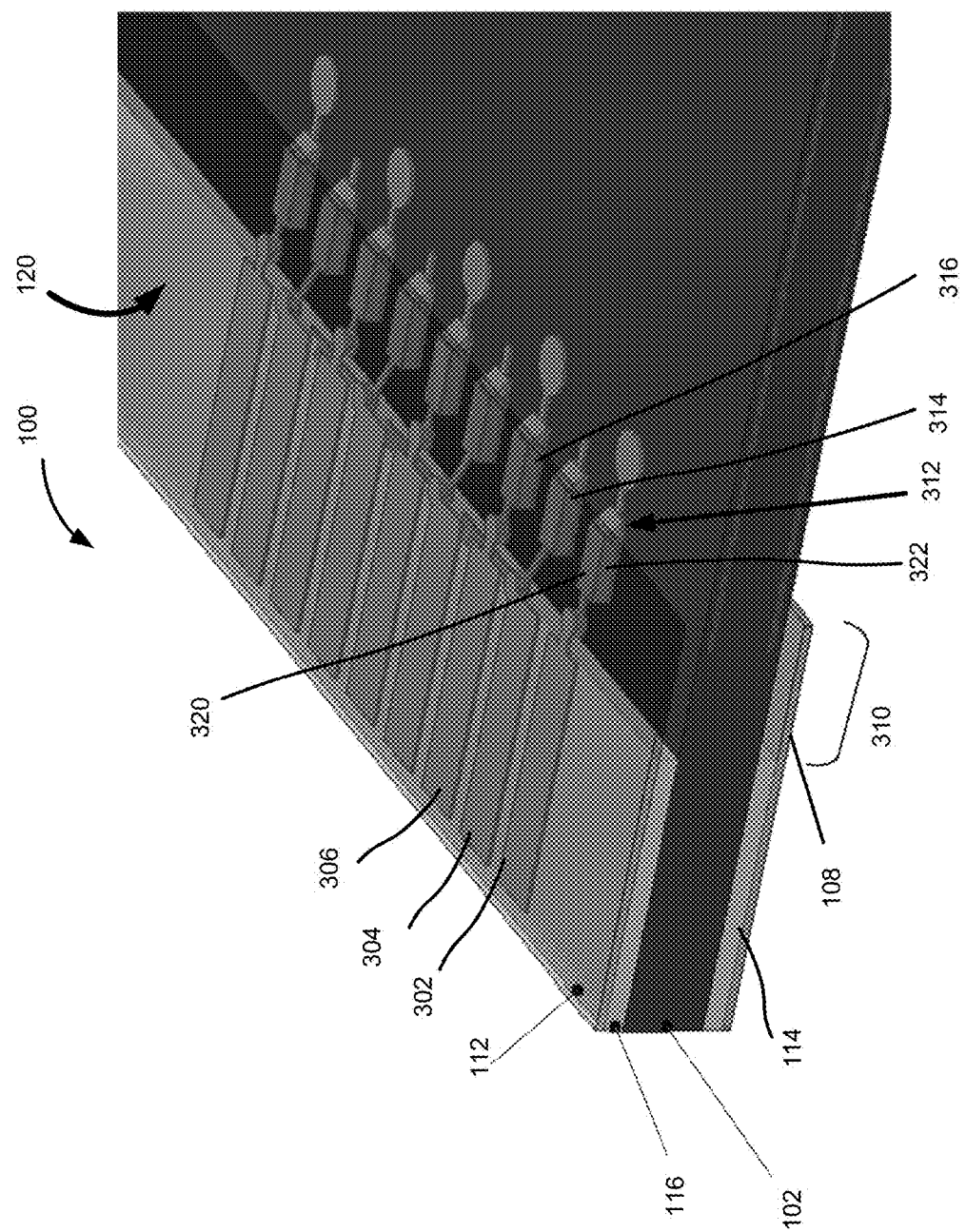
FIG. 3 illustrates a perspective view of a portion of the example memory device of FIG. 1, in accordance with some embodiments

FIG. 3 illustrates a perspective view of a portion of the example memory device of FIG. 1, in accordance with some embodiments. As shown, the insertable portion 120 may include the layers 108 and 112, which may comprise one- or two-layer rigid PCB or FPC. The layers 108 and 112 may be attached to the PCB 102 with respective bonding layers 114 and 116. In some embodiments, layers 108 and 112 may extend beyond their respective bonding layers 114 and 116, as indicated by numeral 310.

In embodiments, a plurality of contacts 302, 304, 306 (indicated in FIG. 1 by 124) may be disposed on the layer 112, to provide electric connections between the memory device 100 and the motherboard (e.g., via the connector slot 202 of FIG. 2). Some of these contacts may be signal contacts, and others may be ground contacts. As shown, the contacts 302, 304, 306 may be electrically connected with the PCB 102 via interconnects 312, 314, and 316 respectively, to provide connections between the PCB 102 and layer and 112. The interconnects 312, 314, 316 may be provided, for example, by hot bar soldering of the interconnect portion (e.g., pad) 320 with interconnect portion (pad) 322 of the interconnect 312.

Figure 4:
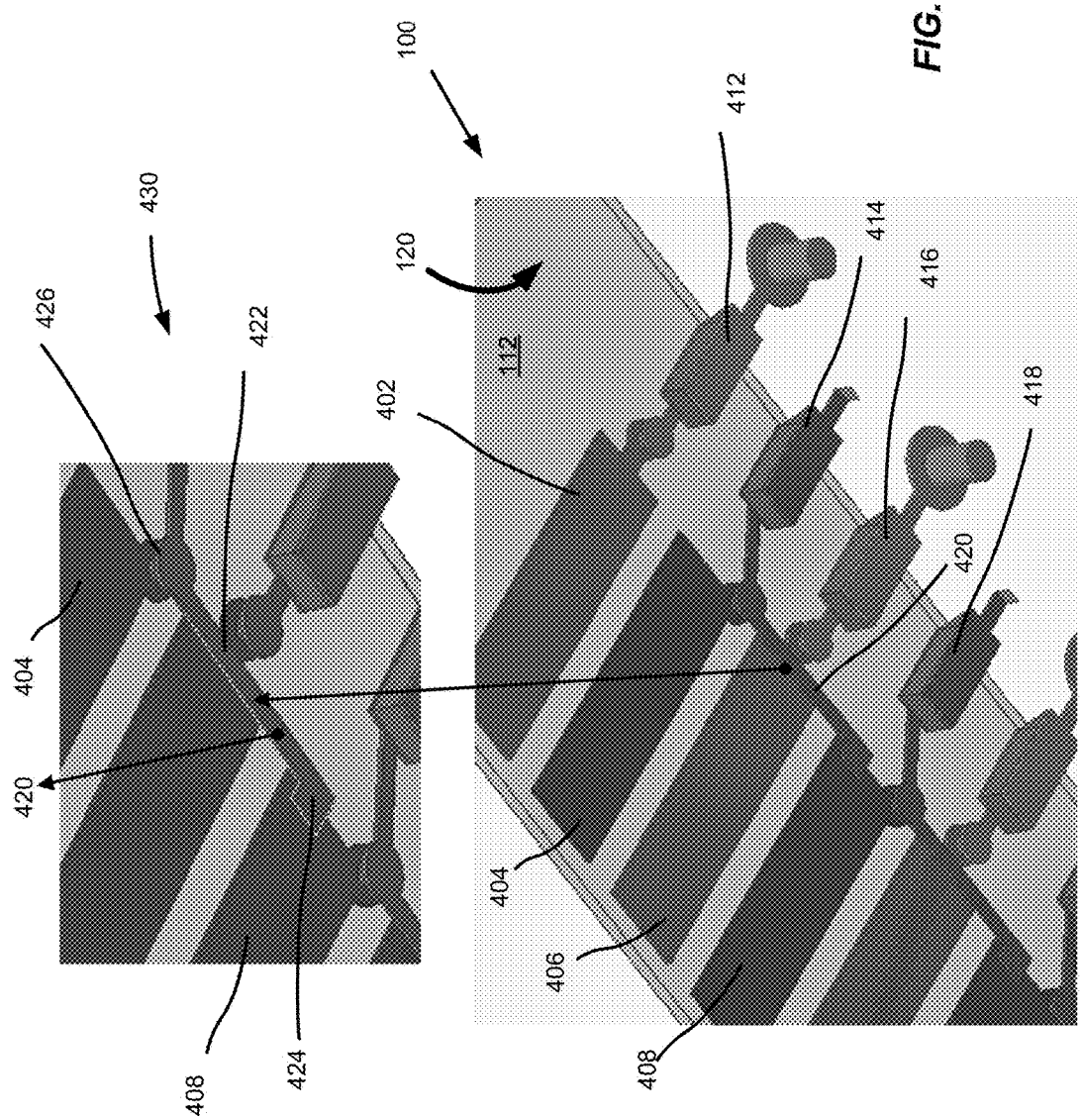
FIG. 4 is a perspective partially transparent view of the insertable portion of the memory device of FIG. 1, in accordance with some embodiments.

FIG. 4 is a perspective partially transparent view of the insertable portion of the memory device of FIG. 1, in accordance with some embodiments. More specifically, FIG. 4 illustrates some aspects of interconnects that provide electric connections of the plurality of contacts disposed on the layer 112 (similar arrangement may be provided for the contacts disposed on the layer 108). For ease of explanation, FIG. 4 shows the bottom perspective and partially transparent view of the layer 112 with contacts 402, 404, 406, 408 visible. Some of the contacts (e.g., 402, 406) may be ground contacts, and some of the contacts (e.g., 404, 408) may be signal contacts. The contacts 402, 404, 406, 408 may be connected with the PCB of the memory device (not shown) via respective interconnects 412, 414, 416, 418.

In some embodiments, the memory device 100 may include capacitance compensation features, in order to reduce crosstalk (e.g., far end crosstalk (FEXT)) between the two adjacent signal contacts. As shown, a capacitance compensation feature 420 may comprise a flag-like shape, and include a connection portion 422 and a pad (e.g., flag-like) portion 424 that extends from the connection portion 422. For ease of understanding, the compensation feature 420 is provided in a blown-up view 430. It should be noted that the flag-like shape of the capacitance compensation feature 420 is provided for purposes of explanation. In general, the capacitance compensation feature may comprise any suitable shape, in order to increase the mutual capacitance between the adjacent signal contacts and thus reduce crosstalk. For example, the capacitance compensation feature may have a circular or other suitable shape. As shown, the connection portion 422 of the capacitance compensation feature 420 may be coupled with one of the contacts (e.g., 404) through a micro-via 426 provided in the layer 112. As shown, the micro-via 426 may also connect the interconnect 414 with the contact 404.

The connection portion 422 may extend over the adjacent signal contact 408, so that the pad portion 424 may be suspended over, but stay free from contact with the adjacent signal contact 408. In embodiments, the capacitance compensation feature 420 may have a pad size of about 0.2 mm by 0.2 mm, and may have a dielectric thickness of about 3 mil.

Experimental studies have shown that the use of capacitance compensation feature as described herein may provide for signal integrity improvement. For example, the frequency domain FEXT improvement may comprise about 20 dB at signal frequency 3 GHz. The p-p time domain crosstalk may be reduced from 23 mV to 3 mV, e.g., by about 85%.

As discussed above, the layers 108 and 112 (see FIG. 1) may comprise one- or two-layer rigid PCB or FPC. In some embodiments, the contacts 402, 404, 406, 408 may be disposed on one of the two layers of the layer 112 (e.g., top layer) and may comprise gold finger type contacts. The interconnects 412, 414, 416, 418 may be disposed on one of the layers of 112 to provide connection with the PCB 102 (as shown in FIG. 3). The capacitance compensation features (e.g., 420) may be disposed on another of the two layers (e.g., bottom layer) of the layer 112. The embodiments described herein provide for the following advantages. The described embodiments of the memory device with insertable portion provided as described herein may be easy to implement. Further, the described embodiment may provide for thinner PCB (DIMM), compared to conventional solution, which may allow for increased air gap between the memory devices, to reduce the air flow impedance for better thermal dissipation, and enable high density high power DIMM. Also, the use of micro-via on the two-layer FPC/PCB may not impacting the regular DIMM PCB and may significantly improve signal integrity by reducing the far end crosstalk on the DIMM connector. Furthermore, the described embodiments provide for a discrete component (capacitance compensation feature) on the FPC/PCB, which may improve performance without impact the DIMM design.

Figure 5:
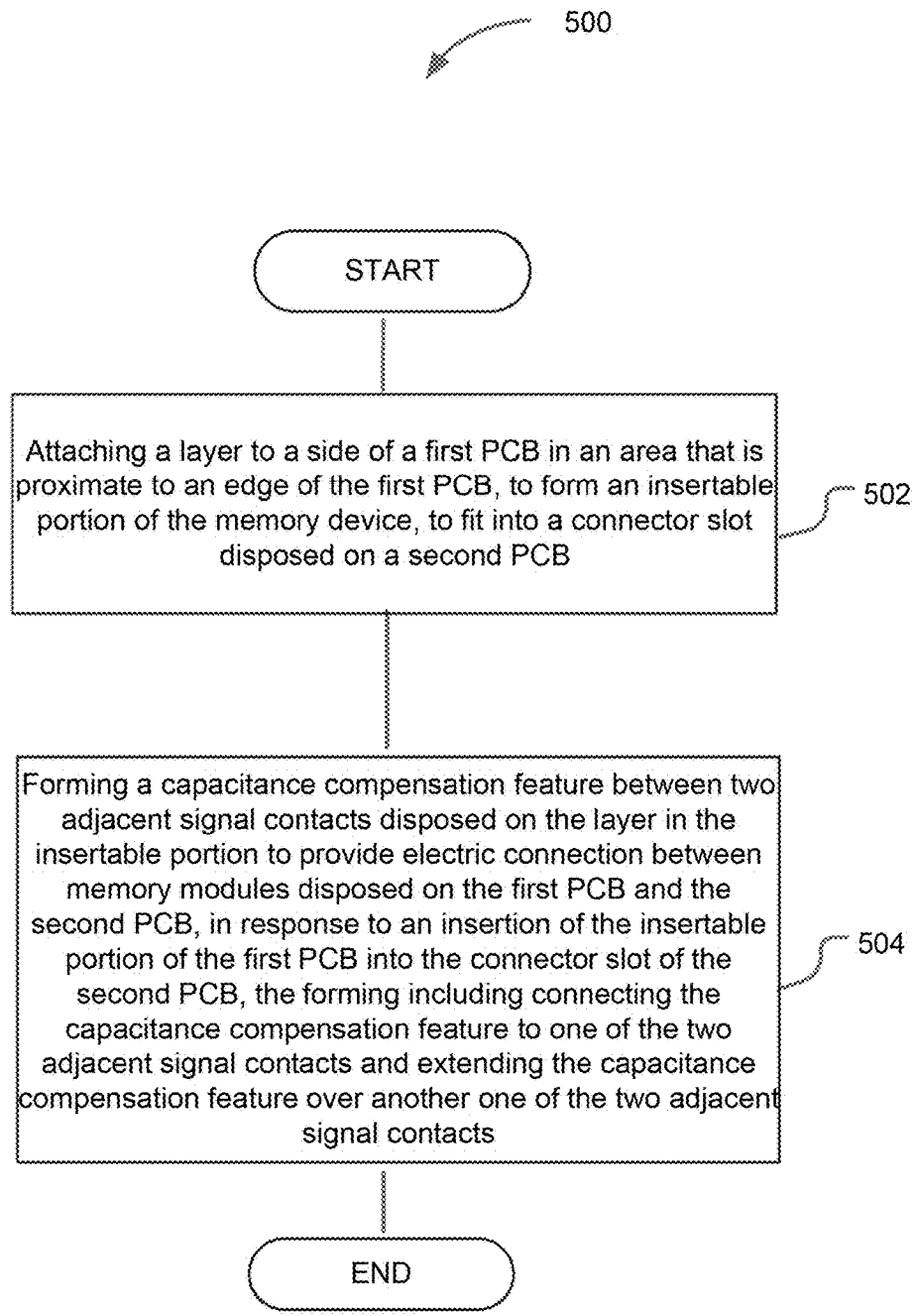
FIG. 5 is a process flow diagram for providing a memory device, in accordance with some embodiments.

FIG. 5 is a process flow diagram for providing a memory device, in accordance with some embodiments. The process 500 may comport with actions described in connection with FIGS. 1-4 in some embodiments. The application of the process 500 to formation of a memory device is provided for purposes of illustration and for ease of understanding.

At block 502, the process 500 may include attaching a layer to a side of a first PCB of the memory device, in an area that is proximate to an edge of the first PCB, to form an insertable portion of the memory device, to fit into a connector slot disposed on a second PCB. The attaching of the layer to the first PCB may provide for a thickness of the insertable portion to fit into the connector slot. In embodiments, the memory device may comprise a DIMM device. The first PCB may be configured to house memory modules, such as DRAM or RCD. The second PCB may comprise a motherboard of a computing device. The layer may comprise an FPC or a rigid PCB.

At block 504, the process 500 may include forming a capacitance compensation feature between two adjacent signal contacts disposed on the layer in the insertable portion. The signal contacts may be configured to provide electric connection between memory modules disposed on the first PCB and the second PCB, in response to an insertion of the insertable portion of the first PCB into the connector slot of the second PCB. Forming the capacitance compensation feature may include connecting the capacitance compensation feature to one of the two adjacent signal contacts and extending the capacitance compensation feature over another one of the two adjacent signal contacts. In embodiments, the capacitance compensation feature may comprise a flag-like shape, and include a connection portion and a pad portion that extends from the connection portion. The connection portion may be connected to one of the contacts through a micro-via. Extending the capacitance compensation feature over the adjacent contact may include suspending the pad portion over the adjacent signal contact.

Various operations of the process 500 are described as multiple discrete operations, in a manner that is most helpful in understanding the claimed subject matter. However, the order of description should not be construed as to imply that these operations are necessarily order dependent. It will be appreciated that the sequence of operations associated with the process 1300 may vary and/or include other actions in accordance with the present disclosure.

The memory device and methods described herein may be implemented into a system using any suitable hardware and/or software to configure as desired.

Figure 6:
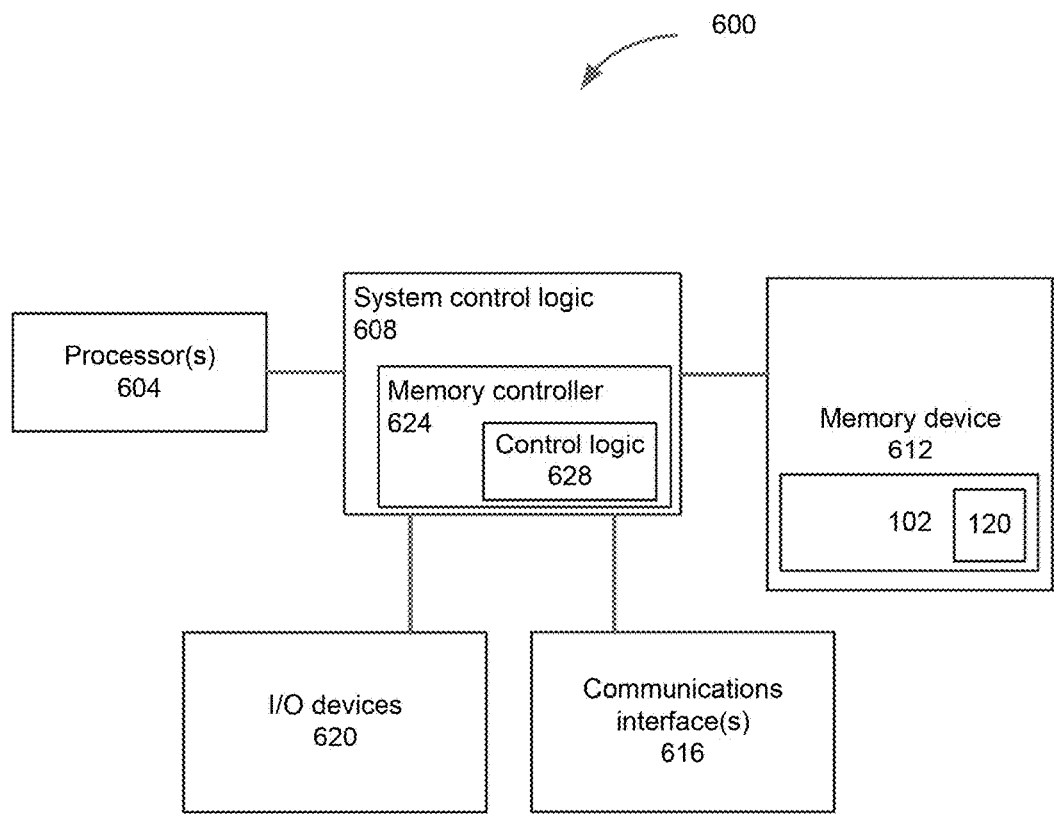
FIG. 6 schematically illustrates an example computing device that may include a memory device as described in FIGS. 1-5, in accordance with some embodiments.

FIG. 6 schematically illustrates an example computing device that may include a memory device as described in FIGS. 1-5, in accordance with some embodiments. The computing device 600 may include system control logic 608 coupled to one or more processor(s) 604; a memory device 612; one or more communications interface(s) 616; and input/output (I/O) devices 620.

In some embodiments, the memory device 612 may be a non-volatile computer storage chip. In some embodiments, the memory device 612 may comprise a memory device 100 of FIG. 1, having the PCB 102 with insertable portion 120 and one or more capacitance compensation features as described in reference to FIGS. 1-5. The memory device may further include driver circuitry (e.g., drivers), input/output connections to electrically couple the memory device 612 with other components of the computing device 600, etc. The memory device 612 may be configured to be removably or permanently coupled with the computing device 600.

Communications interface(s) 616 may provide an interface for computing device 600 to communicate over one or more network(s) and/or with any other suitable device. Communications interface(s) 616 may include any suitable hardware and/or firmware. Communications interface(s) 616 for one embodiment may include, for example, a network adapter, a wireless network adapter, a telephone modem, and/or a wireless modem. For wireless communications, communications interface(s) 616 for one embodiment may use one or more antennas to communicatively couple the computing device 600 with a wireless network.

For one embodiment, at least one of the processor(s) 604 may be packaged together with logic for one or more controller(s) of system control logic 608. For one embodiment, at least one of the processor(s) 604 may be packaged together with logic for one or more controllers of system control logic 608 to form a System in Package (SiP). For one embodiment, at least one of the processor(s) 604 may be integrated on the same die with logic for one or more controller(s) of system control logic 608. For one embodiment, at least one of the processor(s) 604 may be integrated on the same die with logic for one or more controller(s) of system control logic 608 to form a System on Chip (SoC).

System control logic 608 for one embodiment may include any suitable interface controllers to provide for any suitable interface to at least one of the processor(s) 604 and/or to any suitable device or component in communication with system control logic 608. The system control logic 608 may move data into and/or out of the various components of the computing device 600.

System control logic 608 for one embodiment may include a memory controller 624 to provide an interface to the memory device 612 to control various memory access operations. The memory controller 624 may include control logic 628 that may be specifically configured to control access of the memory device 612.

In various embodiments, the I/O devices 620 may include user interfaces designed to enable user interaction with the computing device 600, peripheral component interfaces designed to enable peripheral component interaction with the computing device 600, and/or sensors designed to determine environmental conditions and/or location information related to the computing device 600. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 616 to communicate with components of a positioning network, e.g., a global positioning system (GPS) satellite.

In embodiments, the computing device 600 may comprise a data center. In various embodiments, the computing device 600 may comprise a workstation, a server, or a cluster of servers (server farm). The computing device 600 may have more or fewer components, and/or different architectures. In further implementations, the computing device 600 may be any other electronic device that processes data.

According to various embodiments, the present disclosure describes a number of examples.

Example 1 may be a memory device, comprising: a first printed circuit board (PCB) having a first thickness, to house one or more memory modules disposed on at least one side of the first PCB; and at least one layer having a second thickness, wherein the al least one layer is attached to the at least one side of the first PCB in an area of the at least one side that is proximate to an edge of the first PCB, to form a memory device portion that is insertable into a connector slot disposed on a second PCB, wherein the insertable portion has a thickness that comprises the first and second thicknesses, to fit into the connector slot of the second PCB.

Example 2 may include the memory device of example 1, wherein the first thickness comprises about 0.8 mm, wherein a height of the first PCB comprises about 31.25 mm, and wherein a height of the insertable portion of the first PCB comprises about 4 mm.

Example 3 may include the memory device of example 1, wherein the one or more memory modules comprise one or more first memory modules, wherein the at least one side of the first PCB comprises a first side, wherein the at least one layer comprises a first layer, wherein the PCB further comprises a second side, opposite the first side, to house one or more second memory modules, wherein the memory device further comprises a second layer attached to the second side of the first PCB in an area of the second side that is proximate to the edge of the first PCB, wherein the second layer has the second thickness, wherein the thickness of the insertable portion further includes the second thickness of the second layer, to fit into the connector slot of the second PCB.

Example 4 may include the memory device of example 3, wherein the connector slot has a width of about 1.27 mm, wherein the thickness of the insertable portion comprises about 1.27 mm.

Example 5 may include the memory device of example 4, wherein the first and second layers comprise one of a flexible printed circuit board (FPC) or a rigid PCB.

Example 6 may include the memory device of example 4, wherein the first and second layers are attached to the first PCB with first and second bonding layers respectively, wherein the thickness of the insertable portion further includes thicknesses of the first and second bonding layers, to fit into the connector slot of the second PCB.

Example 7 may include the memory device of example 1, further comprising at least two or more signal contacts disposed on the at least one layer and connected with the first PCB via respective connectors, to provide electric connection between the one or more memory modules and the second PCB, in response to an insertion of the insertable portion of the first PCB into the connector slot of the second PCB.

Example 8 may include the memory device of example 7, further comprising a capacitance compensation feature connected to one of the two or more signal contacts and extending over an adjacent one of the two or more signal contacts, wherein the capacitance compensation feature is free from contact with the adjacent one of the two or more signal contacts.

Example 9 may include the memory device of example 8, wherein the capacitance compensation feature comprises a flag-like shape, and includes a connection portion and a pad portion that extends from the connection portion, wherein the connection portion is connected to the one of the two or more signal contacts through a via, and wherein the pad portion is suspended over the adjacent one of the two or more signal contacts.

Example 10 may include the memory device of example 9, wherein a size of the pad portion comprises about 0.2 mm by 0.2 mm, and wherein a dielectric thickness of the capacitance compensation feature is about 3 mil, wherein the capacitance compensation feature is to reduce crosstalk between the one of the two or more signal contacts and the adjacent one of the two or more signal contacts.

Example 11 may include the memory device of any of examples 1 to 10, wherein the second PCB comprises a motherboard of a computing device, wherein the connector slot on the second PCB comprises a double data rate (DDR5) connector, wherein the memory modules comprise at least one of: dynamic random-access memory (DRAM) or registering clock driver (RCD), wherein the memory device comprises a dual in-line memory module (DIMM).

Example 12 may be a computing device, comprising: a memory device comprising a first printed circuit board (PCB) to house one or more memory modules disposed on first and second sides of the first PCB; and first and second layers attached to respective areas of the first and second sides of the first PCB that are proximate to an edge of the first PCB, to form an insertable portion of the first PCB; and a second PCB having a connector slot to receive the insertable portion of the first PCB, wherein the insertable portion of the first PCB has a thickness that matches a determined width of the slot of the second PCB.

Example 13 may include the computing device of example 12, wherein the second PCB comprises a motherboard of the computing device, wherein the connector slot on the second PCB comprises a double data rate (DDR5) connector, wherein the memory modules comprise at least one of: dynamic random-access memory (DRAM) or registering clock driver (RCD), wherein the memory device comprises a dual in-line memory module (DIMM).

Example 14 may include the computing device of example 12, wherein the determined width of the connector slot comprises 1.27 mm, wherein the thickness of the insertable portion comprises about 1.27 mm, wherein a thickness of the first PCB comprises about 0.8 mm, wherein a height of the first PCB comprises about 31.25 mm, and wherein a height of the insertable portion of the first PCB comprises about 4 mm.

Example 15 may include the computing device of any examples 12 to 14, further comprising at least two or more signal contacts disposed on at least one of the first or second layers and connected with the first PCB via respective connectors, to provide electric connection between at least some of the one or more memory modules and the second PCB, in response to the insertion of the insertable portion of the first PCB into the connector slot of the second PCB.

Example 16 may include the computing device of example 15, further comprising a capacitance compensation feature connected to one of the two or more contacts and extending over an adjacent one of the two or more signal contacts, wherein the capacitance compensation feature is free from contact with the adjacent one of the two or more signal contacts.

Example 17 may be a method for providing a memory device, comprising: attaching at least one layer to at least one side of a first PCB in an area of the at least one side that is proximate to an edge of the first PCB, to form an insertable portion of the memory device, to fit into a connector slot disposed on a second PCB, wherein the first PCB is to house one or more memory modules on the at least one side; and forming a capacitance compensation feature between two adjacent signal contacts disposed on the at least one layer in the insertable portion to provide electric connection between the one or more memory modules and the second PCB, in response to an insertion of the insertable portion of the first PCB into the connector slot of the second PCB, wherein forming the capacitance compensation feature includes connecting the capacitance compensation feature to one of the two adjacent signal contacts and extending the capacitance compensation feature over another one of the two adjacent signal contacts.

Example 18 may include the method of example 17, wherein extending the capacity compensation includes providing the capacitance compensation feature to be free from contact with the other one of the two adjacent signal contacts.

Example 19 may include the method of example 17, wherein the one or more memory modules comprise one or more first memory modules, wherein the at least one side of the first PCB comprises a first side, wherein the at least one layer comprises a first layer, wherein the PCB further comprises a second side, opposite the first side, to house one or more second memory modules, wherein the method further comprises: attaching a second layer to the second side of the first PCB in an area of the second side that is proximate to the edge of the first PCB, the second layer having the second thickness, wherein a thickness of the insertable portion includes a thickness of the first PCB and thicknesses of the first and second layers, to fit into a width of the connector slot of the second PCB.

Example 20 may include the method of example 19, wherein the capacitance compensation feature is a first capacitance compensation feature, wherein two adjacent signal contacts are two adjacent first signal contacts, wherein the method further comprises: forming a second capacitance compensation feature between two adjacent second contacts disposed on the second layer to provide electric connection between the one or more memory modules and the second PCB, in response to an insertion of the insertable portion of the first PCB into the connector slot of the second PCB, wherein forming includes connecting the second capacitance compensation feature to one of the two adjacent second signal contacts and extending the capacitance compensation feature over another one of the two adjacent second signal contacts.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. A memory device, comprising:
   a first printed circuit board (PCB) having a first thickness, a first end, and a second end opposite the first end, wherein the first PCB is to house one or more memory modules disposed on at least one side of the first PCB in an area proximate to the first end of the first PCB, wherein the area of the first PCB proximate the first end has the first thickness;

at least one layer having a second thickness, wherein the at least one layer is attached to the at least one side of the first PCB proximate to an edge of the first PCB that comprises the second end of the first PCB, wherein the second end is to form a memory device portion that is insertable into a connector slot disposed on a second PCB; and an interconnect disposed on the at least one side of the first PCB around the second end of the first PCB to provide an air gap between the at least one layer and the interconnect, wherein the interconnect is to electrically couple the one or more memory modules of the first PCB with the second PCB, wherein the insertable portion has a thickness that comprises the first and second thicknesses, to fit into the connector slot of the second PCB.

2. The memory device of claim 1, wherein the first thickness comprises about 0.8 mm, wherein a height of the first PCB comprises about 31.25 mm, and wherein a height of the insertable portion of the first PCB comprises about 4 mm.

3. The memory device of claim 1, wherein the one or more memory modules comprise one or more first memory modules, wherein the at least one side of the first PCB comprises a first side, wherein the at least one layer comprises a first layer, wherein the PCB further comprises a second side, opposite the first side, to house one or more second memory modules, wherein the memory device further comprises a second layer attached to the second side of the first PCB in an area of the second side that is proximate to the edge of the first PCB, wherein the second layer has the second thickness, wherein the thickness of the insertable portion further includes the second thickness of the second layer, to fit into the connector slot of the second PCB.

4. The memory device of claim 3, wherein the first and second layers comprise one of: a flexible printed circuit board (FPC) or a rigid PCB.

5. The memory device of claim 3, wherein the first and second layers are attached to the first PCB with first and second bonding layers respectively, wherein the thickness of the insertable portion further includes thicknesses of the first and second bonding layers, to fit into the connector slot of the second PCB.

6. The memory device of claim 1, wherein the second PCB comprises a motherboard of a computing device, wherein the connector slot on the second PCB comprises a double data rate (DDR5) connector, wherein the memory modules comprise at least one of: dynamic random-access memory (DRAM) or registering clock driver (RCD), wherein the memory device comprises a dual in-line memory module (DIMM).

7. A computing device, comprising:
a memory device comprising:
a first printed circuit board (PCB) having a first thickness, and a first end and a second end opposite the first end, wherein the first PCB is to house one or more memory modules disposed on first and second sides of the first PCB in an area proximate the first end; first and second layers attached to respective areas of the first and second sides of the first PCB that are proximate to the second end of the first PCB to form an insertable portion of the first PCB; and first and second interconnects disposed on the first and second sides of the first PCB around the second end of the first PCB, to provide first and second air gaps between the first layer and the first interconnect, and between the second layer and the second interconnect respectively, wherein the first and second interconnects are to electrically couple the one or more memory modules of the first PCB with a second PCB; and the second PCB having a connector slot to receive the insertable portion of the first PCB, wherein the insertable portion of the first PCB has a second thickness that is greater than the first thickness of the area proximate the first end of the first PCB, wherein the second thickness that matches a determined width of the slot of the second PCB.

8. The computing device of claim 7, wherein the second PCB comprises a motherboard of the computing device, wherein the connector slot on the second PCB comprises a double data rate (DDR5) connector, wherein the memory modules comprise at least one of: dynamic random-access memory (DRAM) or registering clock driver (RCD), wherein the memory device comprises a dual in-line memory module (DIMM).

9. The computing device of claim 7, wherein the determined width of the connector slot comprises 1.27 mm, wherein the second thickness of the insertable portion comprises about 1.27 mm, wherein a the first thickness of the first PCB comprises about 0.8 mm, wherein a height of the first PCB comprises about 31.25 mm, and wherein a height of the insertable portion of the first PCB comprises about 4 mm.

* * * * *